(12) United States Patent
Chang et al.

(10) Patent No.: US 12,557,315 B2
(45) Date of Patent: Feb. 17, 2026

(54) SEMICONDUCTOR DEVICE AND MANUFACTURING METHOD THEREOF

(71) Applicant: National Yang Ming Chiao Tung University, Hsinchu (TW)

(72) Inventors: Edward Yi Chang, Hsinchu County (TW); You-Chen Weng, New Taipei (TW); Min-Lu Kao, Hsinchu (TW)

(73) Assignee: National Yang Ming Chiao Tung University, Hsinchu (TW)

( * ) Notice: Subject to any disclaimer, the term of this patent is extended or adjusted under 35 U.S.C. 154(b) by 385 days.

(21) Appl. No.: 18/311,249

(22) Filed: May 3, 2023

(65) Prior Publication Data

US 2024/0145575 A1 May 2, 2024

(30) Foreign Application Priority Data

Oct. 28, 2022 (TW) .................................. 111141223

(51) Int. Cl.
*H10D 30/01* (2025.01)
*H10D 30/47* (2025.01)
*H10D 64/23* (2025.01)

(52) U.S. Cl.
CPC ......... *H10D 30/015* (2025.01); *H10D 30/475* (2025.01); *H10D 64/251* (2025.01)

(58) Field of Classification Search
None
See application file for complete search history.

(56) References Cited

U.S. PATENT DOCUMENTS

| 11,335,798 B2 | 5/2022 | Moens et al. |
| 2017/0125572 A1 | 5/2017 | Curatola et al. |
| 2019/0043977 A1* | 2/2019 | Pei ...................... H10D 30/475 |

FOREIGN PATENT DOCUMENTS

| TW | 200415800 A | 8/2004 |
| TW | 202111949 A | 3/2021 |

OTHER PUBLICATIONS

Akio Yamamoto et al., "Metalorganic vapor phase epitaxial growth of AlGaN directly on reactive-ion etching-treated GaN surfaces to prepare AlGaN/GaN heterostructures with high electron mobility (~1500cm2V-1 s-1): Impacts of reactive-ion etching-damaged layer removal," Japanese Journal of Applied Physics, vol. 57, 125501, 2018.
Joel Tacla Asubar et al., "Enhancement-Mode AlGaN/GaN MIS-HEMTs With High VTH and High IDmax Using Recessed-Structure With Regrown AlGaN Barrier," IEEE Electron Device Letters, vol. 41, No. 5, May 2020.
Huaxing Jiang et al., "Thin-barrier heterostructures enabled normally-Off GaN high electron mobility transistors," Semiconductor Science and Technology, vol. 36, 034001, 2021.

(Continued)

*Primary Examiner* — Grant S Withers
(74) *Attorney, Agent, or Firm* — CKC & Partners Co., LLC

(57) ABSTRACT

A semiconductor device includes a substrate, a channel layer, a first barrier layer, a source/drain contact, and a gate layer. The channel layer is on the substrate. The first barrier layer is on the channel layer and the thickness of the first barrier layer is less than 6 nm. The source/drain contact is on the first barrier layer and is directly contact with the first barrier layer. The gate layer is over the first barrier layer.

10 Claims, 12 Drawing Sheets

(56) References Cited

OTHER PUBLICATIONS

Jiaqi He et al., "Recent Advances in GaN-Based Power HEMT Devices," Advanced Electronic Materials, vol. 7, 2001045, 2021.
Masahito Kanamura et al., "Enhancement-Mode GaN MIS-HEMTs With n-GaN/i-AlN/n-GaN Triple Cap Layer and High-k Gate Dielectrics," IEEE Electron Device Letters, vol. 31, No. 3, Mar. 2010.
Yong Cai et al., "High-Performance Enhancement-Mode AlGaN/GaN HEMTs Using Fluoride-Based Plasma Treatment," IEEE Electron Device Letters, vol. 26, No. 7, Jul. 2005.
Yasuhiro Uemoto et al., "A Normally-off AlGaN/GaN Transistor with RonA=2.6mΩcm2 and BVds=640V Using Conductivity Modulation," 2006 International Electron Devices Meeting, 2006.
Yasuhiro Uemoto et al., "Gate Injection Transistor (GIT)—A Normally-Off AlGaN/GaN Power Transistor Using Conductivity Modulation," IEEE Transactions on Electron Devices, vol. 54, No. 12, Dec. 2007.
Tetsuya Fujiwara et al., "Low Ohmic Contact Resistance m-Plane AlGaN/GaN Heterojunction Field-Effect Transistors with Enhancement-Mode Operations," Applied Physics Express, vol. 3, 101002, 2010.
Hiroshi Kambayashi et al., "Normally Off n-Channel GaN MOSFETs on Si Substrates Using an SAG Technique and Ion Implantation," IEEE Electron Device Letters, vol. 28, No. 12, Dec. 2007.
C. H. Wu et al., "High Vth Enhancement Mode GaN Power Devices with High ID, max Using Hybrid Ferroelectric Charge Trap Gate Stack," 2017 Symposium on VLSI Technology Digest of Technical Papers, 2017.

\* cited by examiner

SEMICONDUCTOR DEVICE AND MANUFACTURING METHOD THEREOF

CROSS-REFERENCE TO RELATED APPLICATION

This application claims priority to Taiwan Application Serial Number 111141223, filed Oct. 28, 2022, which is herein incorporated by reference in its entirety.

BACKGROUND

Field of Disclosure

The present disclosure relates to a semiconductor device and a manufacturing method thereof.

Description of Related Art

High electron mobility transistors (HEMT) made of AlGaN/GaN are common semiconductor devices recently, and have advantages such as high switching speed, high gain, high electron mobility and low noise. However, the design of the HEMT structure makes it a normally-on device. Therefore, recent technology is dedicated to design a normally-off HEMT to enhance stability and safety of the circuit and reduce the circuit cost.

SUMMARY

In some embodiments, a semiconductor device includes a substrate, a channel layer on the substrate, a first barrier layer on the channel layer, in which a thickness of the first barrier layer is less than 6 nm, a source/drain contact on the first barrier layer and directly in contact with the first barrier layer, and a gate layer on the first barrier layer.

In some embodiments, a number of aluminum atoms in the first barrier layer account for 10% to 15% of a total number of the aluminum atoms and gallium atoms in the first barrier layer.

In some embodiments, the semiconductor device further includes a second barrier layer on the first barrier layer and in contact with the source/drain contact.

In some embodiments, a proportion of a number of aluminum atoms in the second barrier layer accounting for a total number of the aluminum atoms and gallium atoms in the second barrier layer is higher than a proportion of a number of aluminum atoms in the first barrier layer accounting for the total number of the aluminum atoms and gallium atoms in the first barrier layer.

In some embodiments, the number of the aluminum atoms in the second barrier layer account for 20% to 30% of the total number of the aluminum atoms and the gallium atoms in the second barrier layer.

In some embodiments, the second barrier layer is thicker than the first barrier layer.

In some embodiments, a thickness of the second barrier layer is less than 35 nm.

In some embodiments, the semiconductor device further includes a gate dielectric layer between the gate layer and the first barrier layer, and a thickness of the gate dielectric layer is in a range between 20 nm and 30 nm.

In some embodiments, the gate dielectric layer is further in contact with the second barrier layer.

In some embodiments, the channel layer and the first barrier layer are made of different materials.

In some embodiments, a manufacturing method of a semiconductor device includes forming a channel layer on a substrate, forming a first barrier layer on the channel layer, forming a mask layer on the first barrier layer, patterning the mask layer and forming a plurality of trenches in the mask layer, forming a second barrier layer in the trenches, removing the mask layer, forming a source/drain contact on a portion of the first barrier layer, in which the source/drain contact is in contact with the first barrier layer and the second barrier layer, forming a gate dielectric layer on the other portion of the first barrier layer and the second barrier layer, in which the gate dielectric layer is in contact with the first barrier layer and the second barrier layer, and forming a gate layer on the gate dielectric layer.

In some embodiments, after patterning the mask layer, the mask layer includes a first portion and a second portion, the first portion defines a location of the source/drain contact, and the second portion defines a location of the gate layer.

In some embodiments, patterning the mask layer includes forming a photoresist layer on the mask layer, forming a pattern in the photoresist layer, in which the pattern exposes a top surface of the mask layer, and removing the mask layer exposed by the pattern of the photoresist layer by using a solvent, and exposing a top surface of the first barrier layer.

In some embodiments, the solvent has a removal selectivity among the mask layer, the first barrier layer and the second barrier layer, and after removing the mask layer, the first barrier layer and the second barrier layer remain unremoved.

In some embodiments, after removing the mask layer, the second barrier layer defines a first region and a second region, wherein the first region defines a location of the source/drain contact, and the second region defines a location of the gate layer.

In some embodiments, a thickness of the first barrier layer is less than 6 nm.

In some embodiments, a thickness of the second barrier layer is less than 35 nm.

In some embodiments, a number of aluminum atoms in the first barrier layer account for 10% to 15% of a total number of the aluminum atoms and gallium atoms in the first barrier layer.

In some embodiments, a number of aluminum atoms in the second barrier layer account for 20% to 30% of a total number of the aluminum atoms and gallium atoms in the second barrier layer.

In some embodiments, a thickness of the gate dielectric layer is in a range between 20 nm and 30 nm.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
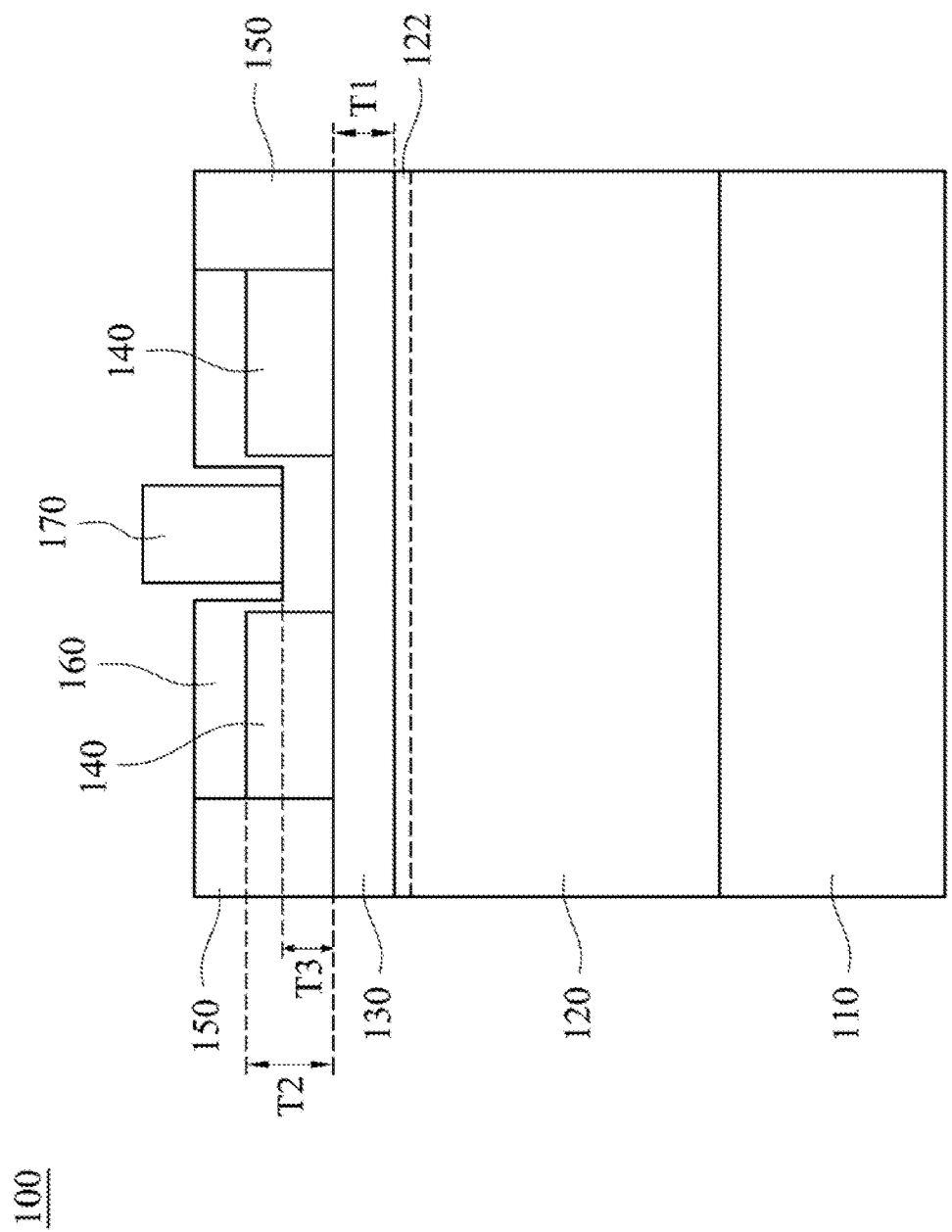
FIG. 1 illustrates a cross-section view of a semiconductor device in some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The present disclosure is related to semiconductor devices, such as processes and the structures of normally-off high electron mobility transistors (HEMT). The semiconductor devices that do not require precise etching in the manufacturing process may be achieved by modifying the thickness and the aluminum proportion of the barrier layer in the semiconductor devices in some embodiments of the present disclosure. As such, the error resulting from the process may be reduced.

FIG. 1 illustrates a cross-section view of a semiconductor device 100 in some embodiments of the present disclosure. The semiconductor device 100 is a normally-off semiconductor device 100. The semiconductor device 100 includes a substrate 110, a channel layer 120, a first barrier layer 130, a source/drain contact 150 and a gate layer 170.

The channel layer 120 is on the substrate 110. The first barrier layer 130 is on the channel layer 120. The source/drain contact 150 is on the first barrier layer 130 and directly in contact with the first barrier layer 130. The gate layer 170 is on the first barrier layer 130. In some embodiments, the semiconductor device 100 further includes a second barrier layer 140 and a gate dielectric layer 160. The second barrier layer 140 is on the first barrier layer 130 and in contact with the source/drain contact 150. The gate dielectric layer 160 is between the gate layer 170 and the first barrier layer 130, and the gate dielectric layer 160 is further in contact with the second barrier layer 140.

When applying positive voltage to the gate layer 170, the channel layer 120 includes a two-dimensional electron gas (2DEG) layer 122. The 2DEG layer 122 is formed by a heterojunction between the channel layer 120 and the first barrier layer 130 made of different materials. The channel layer 120 is made of GaN, and the first barrier layer 130 is made of AlGaN. Generally, HEMT is a normally-on semiconductor device. That is, even though the voltage is not applied to the gate, the 2DEG layer also turns on the source and the gate. In some embodiments of the present disclosure, the thickness T1 of the first barrier layer 130 may be designed to increase the threshold voltage of the semiconductor device 100, so that the semiconductor device 100 becomes the normally-off HEMT. That is, a positive voltage is required to be applied to the gate layer 170 to form the 2DEG layer 122 (or make the 2DEG layer 122 much obvious) to turn on the semiconductor device 100. As such, the stability and the safety of the circuit may be enhanced. In some embodiments, the thickness T1 of the first barrier layer 130 is less than 6 nm, or the number of aluminum atoms in the first barrier layer 130 account for 10% to 15% of a total number of the aluminum atoms and gallium atoms in the first barrier layer 130. When the first barrier layer 130 is thin enough, such as the thickness T1 is less than 6 nm, the thickness T1 of the first barrier layer 130 is not thick enough to form the 2DEG layer 122 (or the 2DEG layer 122 is very unobvious) when no positive voltage is applied to the gate layer 170. When the proportion of the number of aluminum atoms in the first barrier layer 130 accounting for the total number of the aluminum atoms and gallium atoms is in a suitable range, such as 10% to 15%, the aluminum proportion is low. Therefore, the 2DEG layer 122 is not formed (or the 2DEG layer 122 is very unobvious) under the condition that the voltage is not applied to the gate layer 170. When the thickness T1 and the proportion of the number of aluminum atoms accounting for the total number of the aluminum atoms and gallium atoms of the first barrier layer 130 are not within the disclosed range, the semiconductor device 100 becomes normally-on device, so that the stability and the safety of the circuit are reduced. Alternatively, if aluminum proportion is too low, even though the positive voltage is applied to the gate layer 170, it is difficult to turn on the device and the device has great $R_{on}$. The resistance between the gate layer 170 and the source/drain contact 150 also increases, and the semiconductor device 100 may be damaged due to large difference of sheet resistance.

The thickness and the composition of the second barrier layer 140 may also be designed to further modify the performance of the semiconductor device 100. In some embodiments, a number of aluminum atoms in the second barrier layer 140 account for 20% to 30% of a total number of the aluminum atoms and gallium atoms in the second barrier layer 140, or the thickness T2 of the second barrier layer 140 is less than 35 nm. The proportion of the number of aluminum atoms in the second barrier layer 140 accounting for the total number of the aluminum atoms and gallium atoms in the second barrier layer 140 is higher than the proportion of the number of aluminum atoms in the first barrier layer 130 accounting for the total number of the aluminum atoms and gallium atoms in the first barrier layer 130, and the second barrier layer 140 is thicker than the first barrier layer 130. Therefore, the second barrier layer 140 may provide much better polarization to increase the output current of the semiconductor device 100. If the thickness T2 of the second barrier layer 140 is not within the disclosed range, it is easy to have cracks and defects in the second barrier layer 140 since the second barrier layer 140 is too thick, or the second barrier layer 140 is too thin to provide good polarization. If the proportion of the number of aluminum atoms in the second barrier layer 140 accounting for the total number of the aluminum atoms and gallium atoms is not within the disclosed range, the number of the aluminum atoms in the second barrier layer 140 may be too small to provide good polarization. Alternatively, there may be too many aluminum atoms in the second barrier layer 140, leading to micro-cracks on the surface of the second barrier layer 140. The semiconductor device 100 may fail accordingly.

The thickness T3 of the gate dielectric layer 160 may also be designed to further improve the performance of the semiconductor device 100. In some embodiments, the thickness T3 of the gate dielectric layer 160 is in a range between 20 nm and 30 nm. The thickness T3 of the gate dielectric layer 160 is adjusted to determine the increasing level of the threshold voltage of the semiconductor device 100. The gate dielectric layer 160 having the thickness T3 within the disclosed range may be used to increase the threshold voltage of the semiconductor device 100, and the threshold voltage of the semiconductor device 100 is increased to a suitable level. If the thickness T3 of the gate dielectric layer 160 is less than the disclosed range, the threshold voltage may be not within the suitable range for operation. If the thickness T3 of the gate dielectric layer 160 is more than the disclosed range, the gate dielectric layer 160 tends to peeling off during manufacturing processes.

Figure 2:
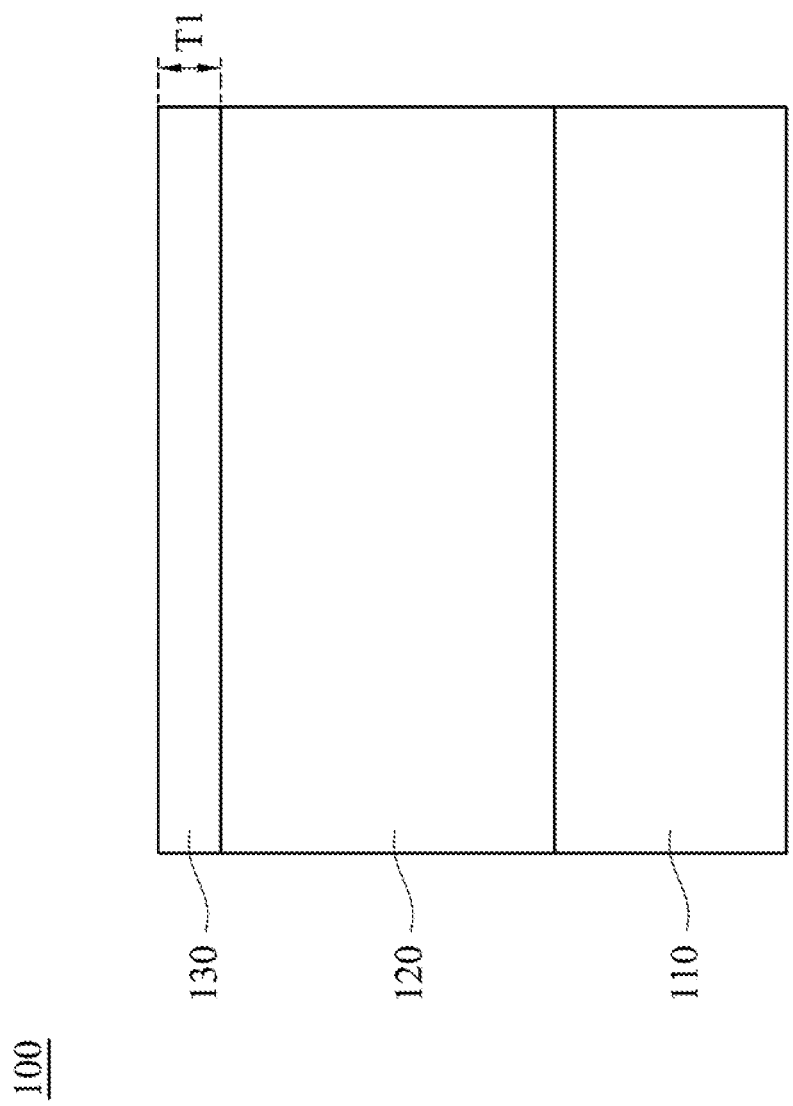
FIGS. 2-12 illustrate cross-section views of the process of the semiconductor device in some embodiments of the present disclosure.

FIGS. 2-12 illustrate cross-section views of the process of the semiconductor device 100 in some embodiments of the present disclosure. Referring to FIG. 2, a channel layer 120 is formed on the substrate 110. Subsequently, a first barrier layer 130 is formed on the channel layer 120, and the material of the first barrier layer 130 is different from the material of the channel layer 120. The substrate 110, channel layer 120 and the first barrier layer 130 may be made of any suitable materials. For example, the substrate 110 may be made of silicon, the channel layer 120 may be made of GaN, and the first barrier layer 130 may be made of AlGaN. In some embodiments, the number of aluminum atoms in the first barrier layer 130 account for 10% to 15% of a total number of the aluminum atoms and gallium atoms in the first barrier layer 130, or the thickness T1 of the first barrier layer 130 is less than 6 nm. In some embodiments, a buffer layer is formed between the substrate 110 and the channel layer 120. The buffer layer may be made of GaN, and the GaN of the buffer layer and the GaN of the channel layer 120 may be doped with different materials or the composition may be different.

Figure 3:
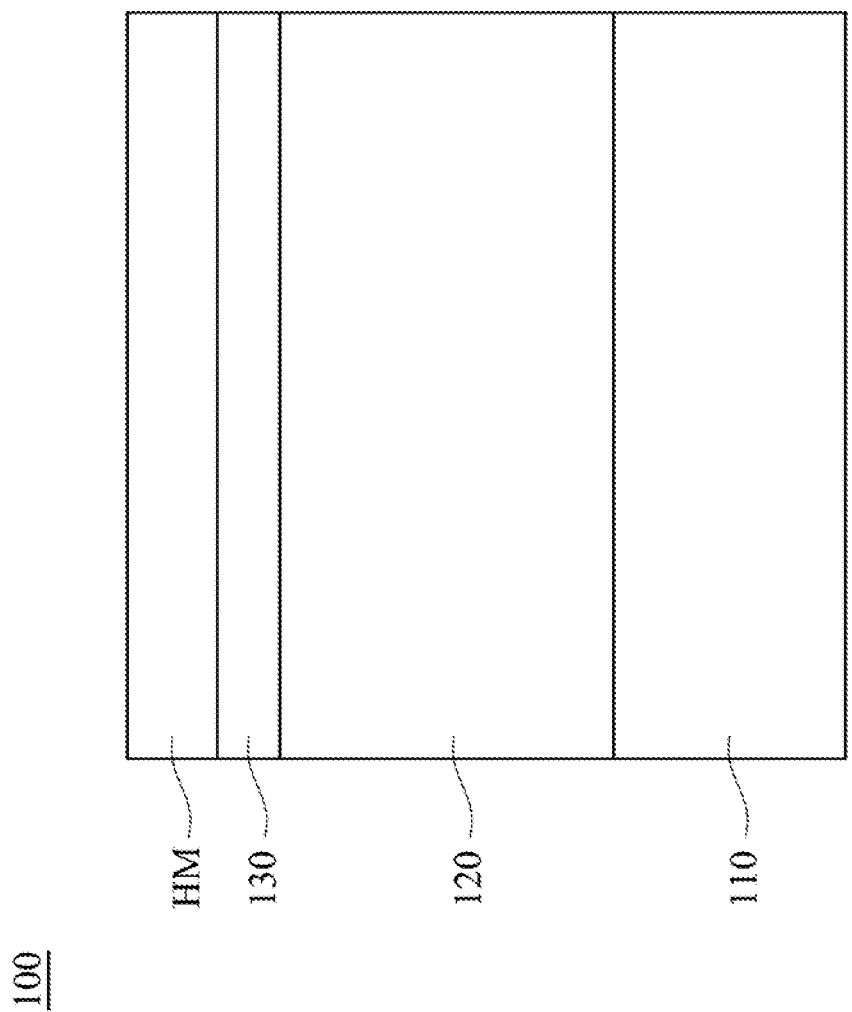
Figure 4:
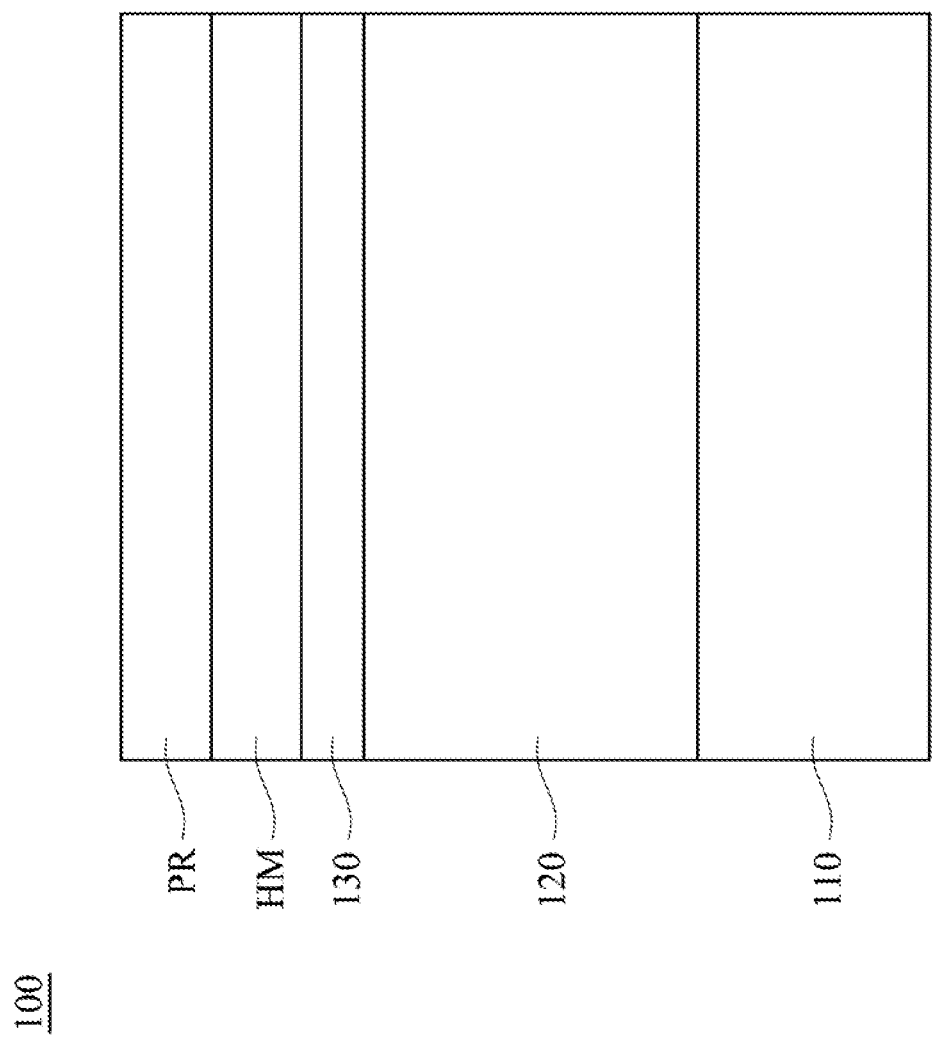

Referring to FIG. 3, a mask layer HM is formed on the first barrier layer 130. The mask layer HM and the first barrier layer 130 are made of different materials. For example, the mask layer HM may be made of silicon oxide.

Figure 5:
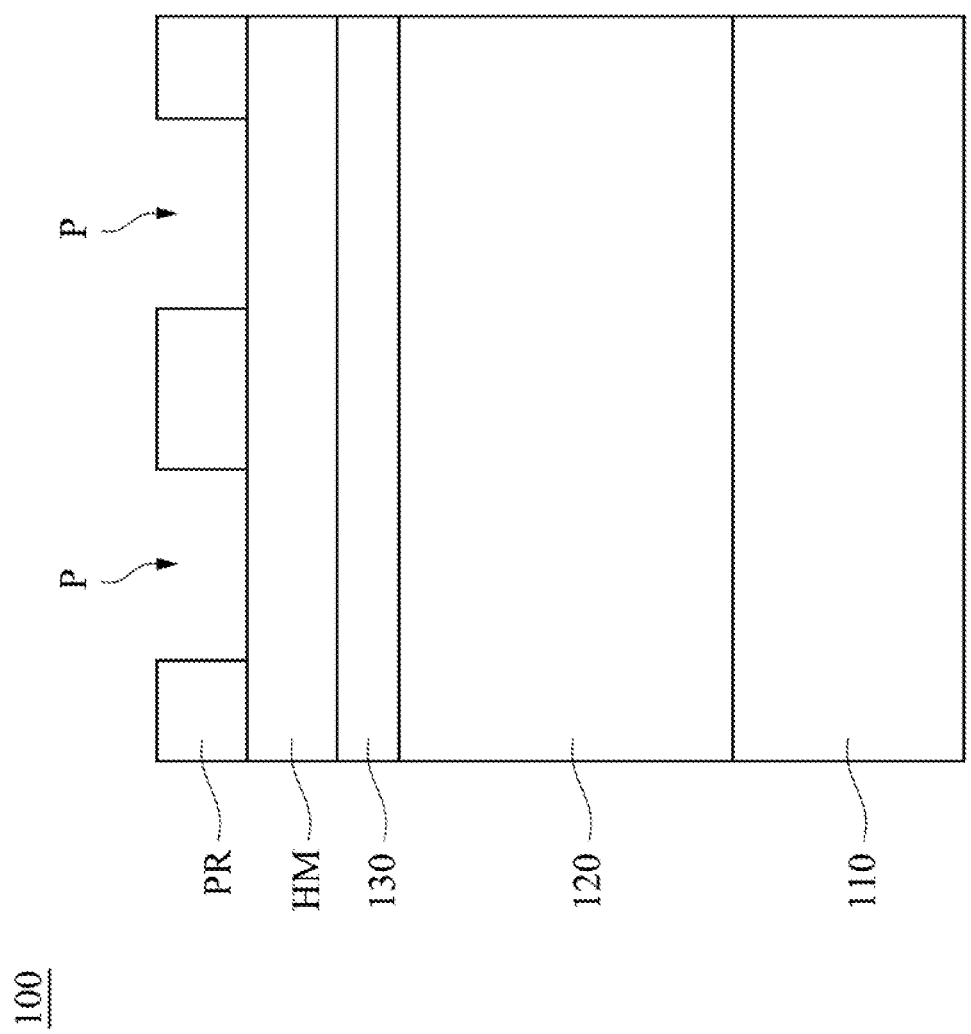
Figure 6:
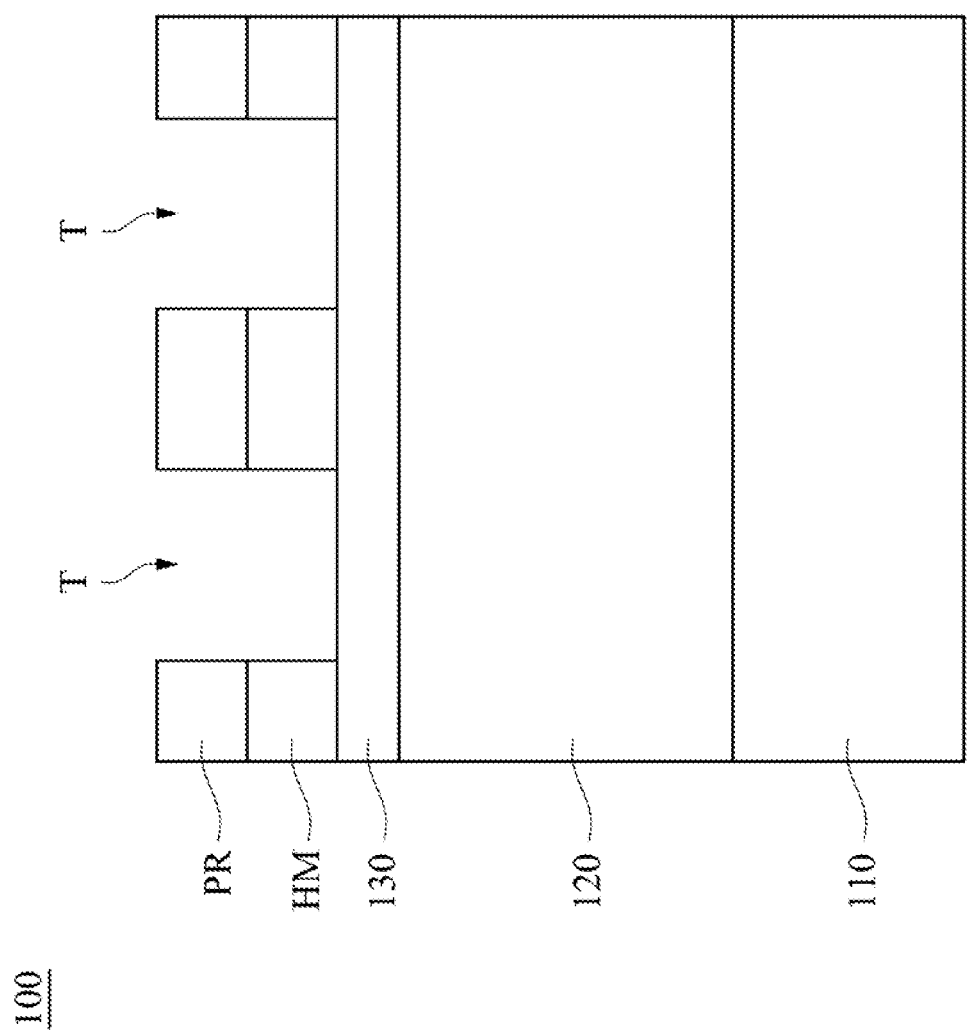
Figure 7:
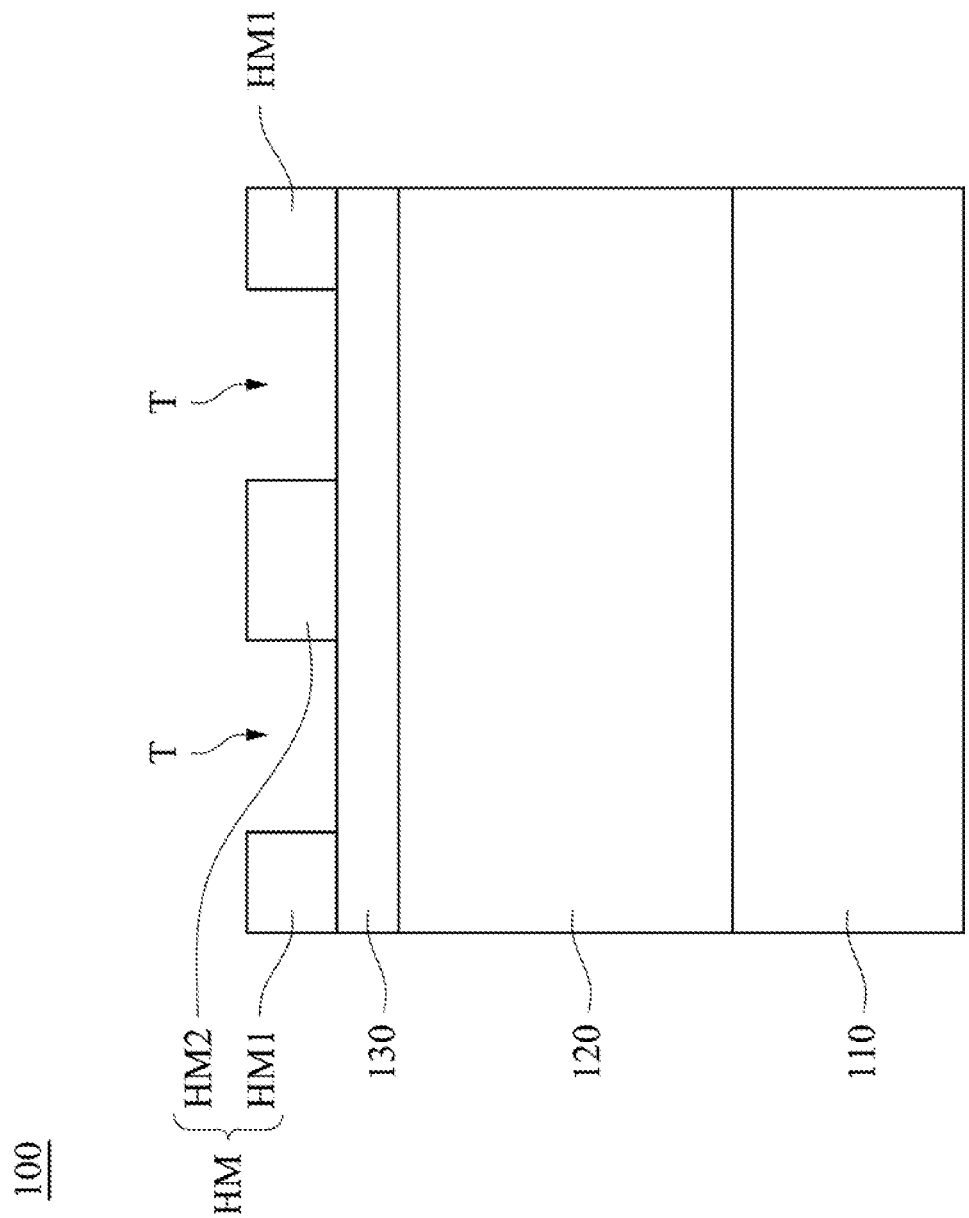

Referring to FIGS. 4-8, a regrown process is performed to form a second barrier layer 140. First, referring to FIGS. 4-7, the mask layer HM is patterned, and a plurality trenches T are formed in the mask layer HM. Specifically, referring to FIG. 4, a photoresist layer PR is formed on the mask layer HM. Subsequently, referring to FIG. 5, a pattern P is formed in the photoresist layer PR, and the pattern P exposes the top surface of the mask layer HM. For example, firstly, the photoresist layer PR may be exposed by a certain pattern, then the photoresist layer PR is developed to form the pattern P in the photoresist layer PR. Subsequently, referring to FIG. 6, the mask layer HM exposed by the pattern P of the photoresist layer PR is removed by a solvent, and the top surface of the first barrier layer 130 is exposed. When using the solvent to remove a portion of the mask layer HM, the solvent has a removal selectivity between the mask layer HM and the first barrier layer 130. Therefore, the semiconductor device 100 in FIG. 5 is immersed in the solvent to remove the mask layer HM exposed by the pattern P of the photoresist layer PR, and the first barrier layer 130 remains unremoved. Removing the mask layer HM by this method will not damage the top surface of the first barrier layer 130, and time control may be looser due to the high removal selectivity of the solvent between the mask layer HM and the first barrier layer 130. For example, if the semiconductor device 100 is immersed in the solvent for a long time, the first barrier layer 130 is still not removed. The pattern P of the photoresist layer PR is transferred to the mask layer HM, and the trenches T are formed in the mask layer HM. Finally, referring to FIG. 7, the photoresist layer PR is removed, and the patterned mask layer HM having the trenches T remains. After patterning the mask layer HM, the mask layer HM includes a first portion HM1 and a second portion HM2, the first portion HM1 defines the location of the source/drain contact (such as the source/drain contact 150 in later discussion), and the second portion HM2 defines the location of the gate layer (such as the gate layer 170 in later discussion). The first portion HM1 and the second portion HM2 are alternately arranged on the first barrier layer 130. For example, a second portion HM2 is between two first portions HM1.

Figure 8:
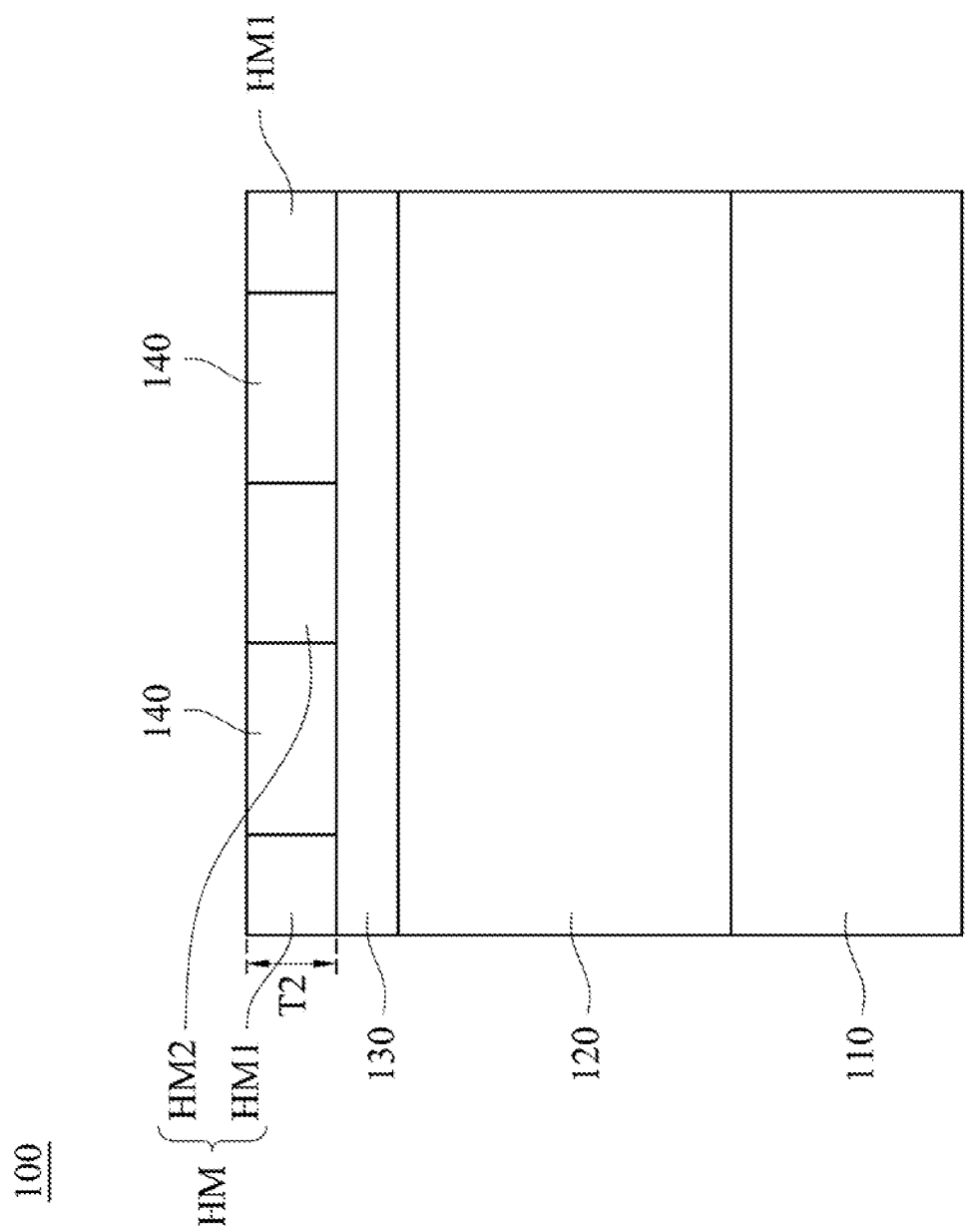

Subsequently, referring to FIG. 8, the second barrier layer 140 is formed in the trenches T. Specifically, the trenches T may be used to define the formation range of the second barrier layer 140. In some embodiments, the second barrier layer 140 may be made of AlGaN. The number of aluminum atoms in the second barrier layer 140 account for 20% to 30% of a total number of the aluminum atoms and gallium atoms, or the thickness T2 of the second barrier layer 140 less than 35 nm.

Figure 9:
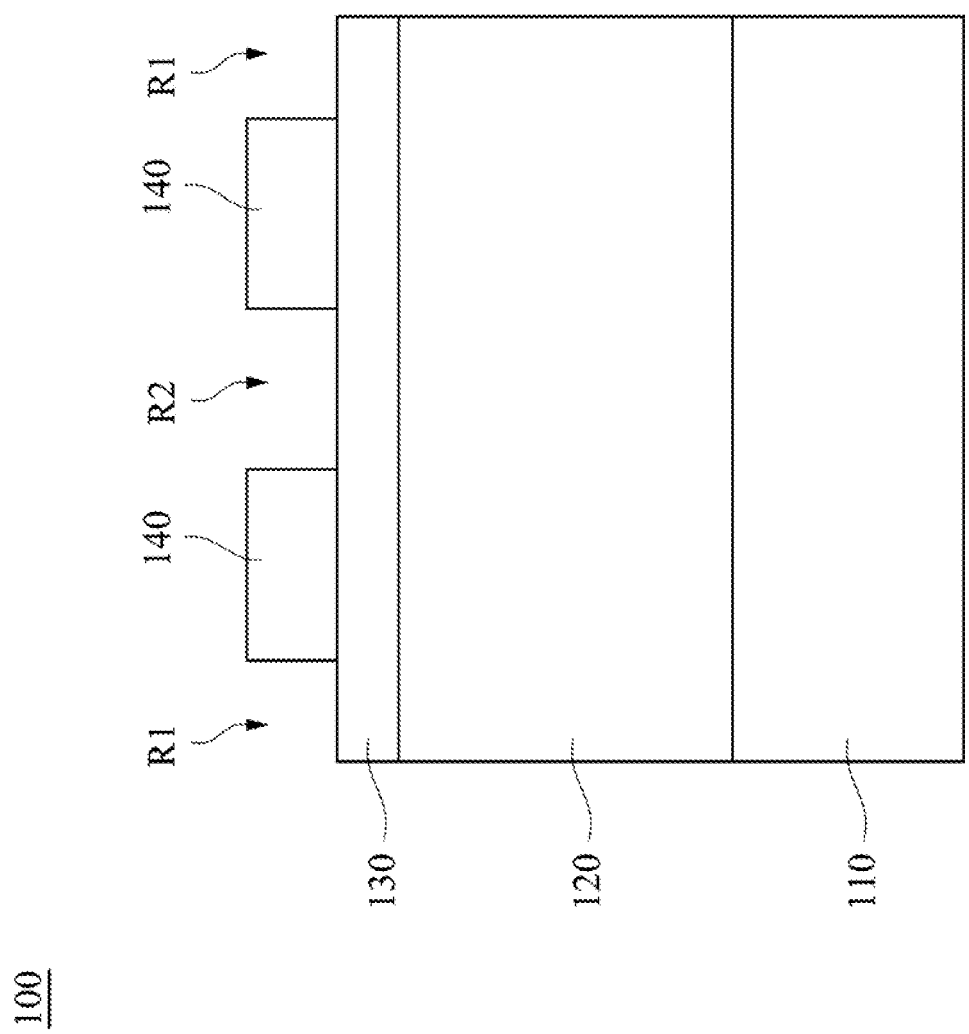

Referring to FIG. 9, the mask layer HM is removed, and the second barrier layer 140 remains. Specifically, the mask layer HM is removing by using the solvent, and the top surface of the first barrier layer 130 is exposed. When using the solvent to remove the mask layer HM, the solvent has a removal selectivity among the mask layer HM, the first barrier layer 130 and the second barrier layer 140. Therefore, the semiconductor device 100 in FIG. 8 is immersed in the solvent to remove the mask layer HM, and the first barrier layer 130 and the second barrier layer 140 remain unremoved. After removing the mask layer HM, the second barrier layer 140 defines a first region R1 and a second region R2. In the first region R1 and the second region R2, the top surface of the first barrier layer 130 is entirely exposed. The first region R1 corresponds to the first portion HM1 of the mask layer HM in FIG. 7, and the second region R2 corresponds to the second portion HM2 of the mask layer HM in FIG. 7. The first region R1 defines the location of the source/drain contact (such as the source/drain contact 150 in later discussion), and the second region R2 defines the location of the gate layer (such as the gate layer 170 in later discussion).

Figure 10:
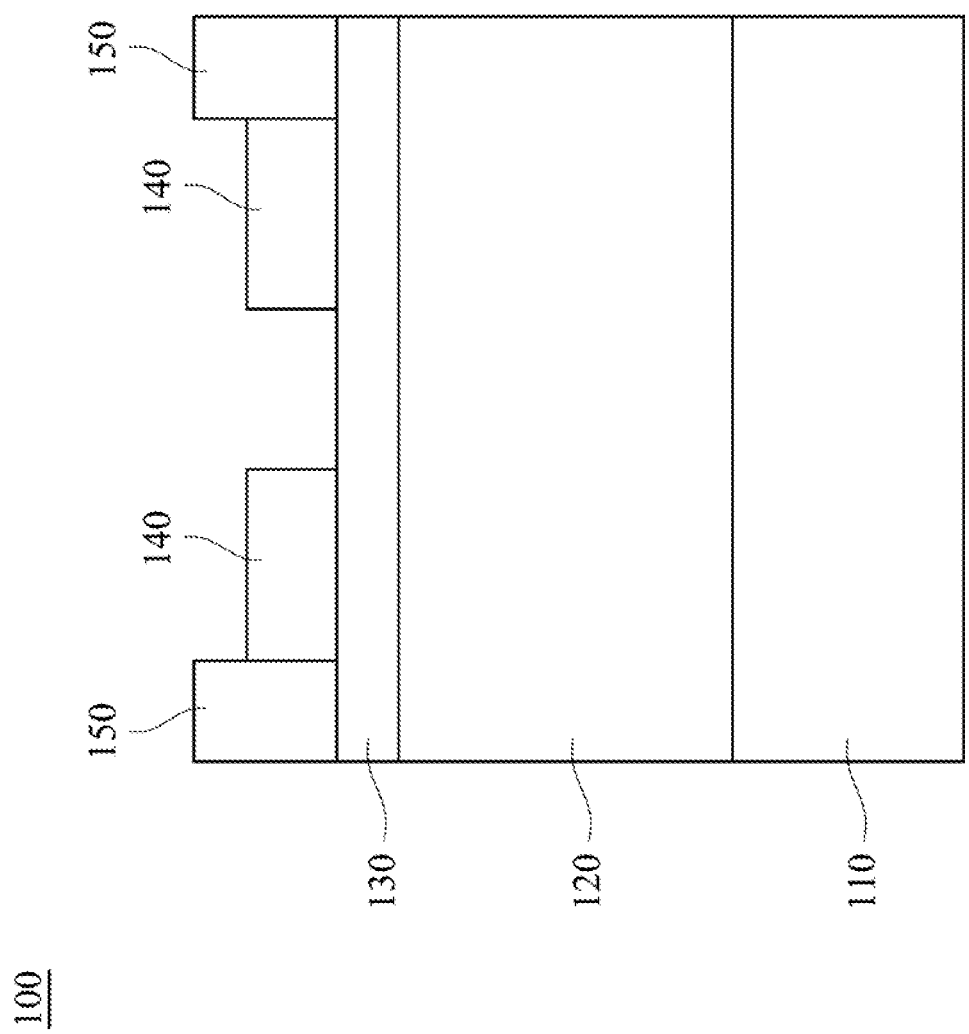

Referring to FIG. 10, the source/drain contact 150 is formed on a portion of the first barrier layer 130, and the source/drain contact 150 is in contact with the first barrier layer 130 and the second barrier layer 140. For example, the source/drain contact 150 is formed in the first region R1. In some embodiments, a lift-off process is performed to form the source/drain contact 150. Specifically, a photoresist layer is first formed on the second barrier layer 140 and the second region R2, and the first region R1 is exposed. Subsequently, a material layer for forming the source/drain contact 150 is formed on the photoresist layer and the first region R1. Finally, a solvent is used to remove the photoresist layer, the material layer on the photoresist layer is removed along with the photoresist layer, and the source/drain contact 150 remains in the first region R1. In some embodiments, the source/drain contact 150 may be made of metals, such as titanium, aluminum, nickel, gold, copper aluminum alloy, the like, or combinations thereof. The source/drain contact 150 is directly in contact with the first barrier layer 130. Since the first barrier layer 130 is thin, such as less than 6 nm, the distance between the source/drain contact 150 and 2DEG layer 122 (FIG. 1) of the channel layer 120 is small, and the resistance between the source/drain contact 150 and the 2DEG layer 122 (FIG. 1) is also reduced. Since the first region R1 exposed the first barrier layer 130 has already been defined in FIG. 9, no additional etching process (such as forming a trench in the second barrier layer 140) is needed to define the location of the source/drain contact 150. Therefore, there is no need to precisely control the depth in the etching process to define the location of the bottom of the source/drain contact 150 at the vertical direction. As such, the error resulting from the etching process is reduced.

Figure 11:
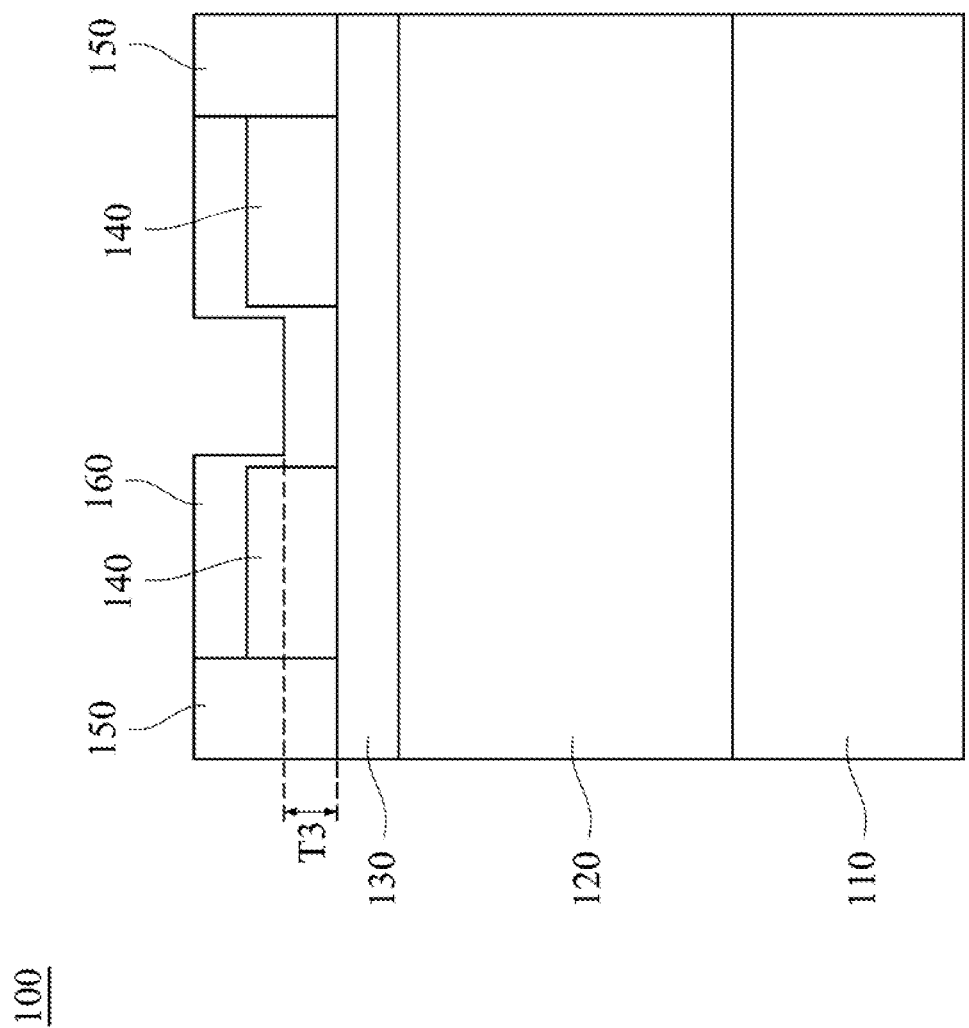

Referring to FIG. 11, the gate dielectric layer 160 is formed on the other portion of the first barrier layer 130 and the second barrier layer 140, and the gate dielectric layer 160 is in contact with the first barrier layer 130 and the second barrier layer 140. For example, the gate dielectric layer 160 is formed in the second region R2, and further extends on the top surface of the second barrier layer 140. In some embodiments, an atomic layer deposition (ALD) or a plasma-enhanced chemical vapor deposition (PECVD) is performed to form the gate dielectric layer 160. Specifically, the ALD or PECVD process is performed to grow the aluminum oxide layer on the surface of the first barrier layer 130, the second barrier layer 140 and the source/drain contact 150. Subsequently, a photoresist layer is formed to cover the surface of the first barrier layer 130 and the second barrier layer 140, and exposes the source/drain contact 150. Subsequently, an etching process is used to etch the aluminum oxide layer on the source/drain contact 150, and the gate dielectric layer 160 in the second region R2 and on the second barrier layer 140 remains. In some embodiments, the gate dielectric layer 160 may be made of aluminum oxide. During forming the gate dielectric layer 160, the thickness T3 of the gate dielectric layer 160 is controlled. In some embodiments, the thickness T3 of the gate dielectric layer 160 is in a range between 20 nm and 30 nm.

Figure 12:
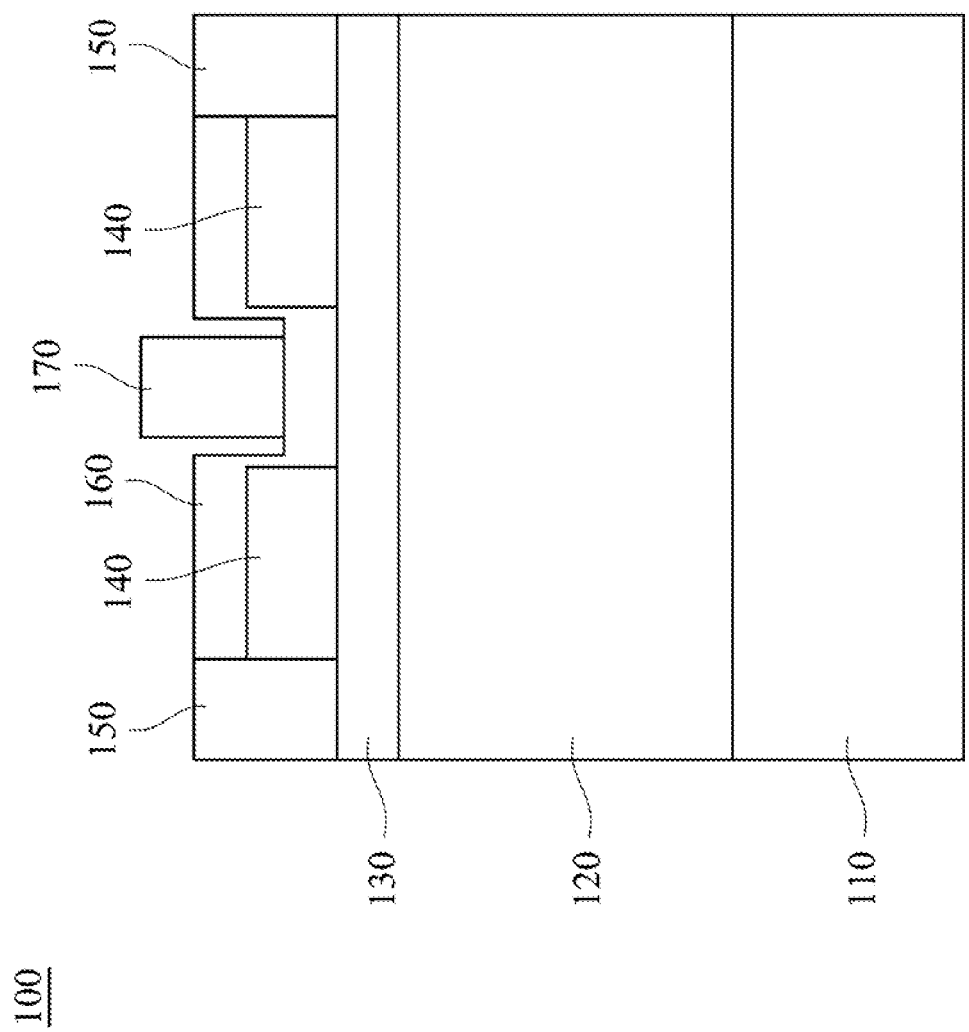

Referring to FIG. 12, a gate layer 170 is formed on the gate dielectric layer 160. The gate layer 170 may be formed between the second barrier layers 140 and on the gate dielectric layer 160. In some embodiments, a lift-off process may be performed to form the gate layer 170. Specifically, firstly, a photoresist layer is form on the source/drain contact 150 and the second barrier layer 140, and exposed the region between the second barrier layers 140. Subsequently, a material layer for forming the gate layer 170 is formed on the photoresist layer and the second barrier layer 140. Finally, a solvent is used to remove the photoresist layer, the material layer on the photoresist layer is removed along with the photoresist layer, and the gate layer 170 remains between the second region R2 and on the gate dielectric layer 160. In some embodiments, the gate layer 170 may be made of metal, such as nickel gold alloy or the alloy of nickel and other low-resistance metal. The first barrier layer 130 is thin, such as less than 6 nm. Therefore, even if the gate dielectric layer 160 and the gate layer 170 are directly formed on the first barrier layer 130 instead of in the recess of the first barrier layer 130, the semiconductor device 100 may also be a normally-off device. That is, the second region R2 exposed the first barrier layer 130 has already been defined in FIG. 9, no additional etching process (such as forming trenches in the first barrier layer 130 and the second barrier layer 140) is needed to define the location of the gate dielectric layer 160 and the gate layer 170. Therefore, there is no need to precisely control the depth in the etching process to define the location of the gate dielectric layer 160 at the vertical direction. As such, the error resulting from the etching process is reduced.

As mentioned above, the error resulting from the manufacturing process of the semiconductor devices is reduced in some embodiments of the present disclosure. Specifically, a mask layer may be used to define the locations of the source/drain contact, the gate dielectric layer and the gate layer. After forming the second barrier layer, the mask layer is directly removed, and the source/drain contact and the gate dielectric layer are sequentially formed on the first barrier layer directly. Subsequently, the gate layer is formed on the gate dielectric layer. That is, the source/drain contact and the gate dielectric layer are directly formed on the first barrier layer. No prior etching process is needed to define the locations of the source/drain contact and the gate dielectric layer in the first barrier layer or the second barrier layer. Since the thickness and the composition of the first barrier layer are designed, the underlying 2DEG layer can be cut off without prior etching process. Moreover, the resistance between the source/drain contact directly formed on the first barrier layer and the 2DEG layer may be reduced. In addition, the thickness and the composition of the second barrier layer are designed to further improve the performance of the semiconductor device. With the advantages mentioned above, the normally-off semiconductor device is obtained without precise etching process, so the manufacturing process error of forming the normally-off semiconductor device is reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a semiconductor device, comprising:
   forming a channel layer on a substrate;
   forming a first barrier layer on the channel layer;
   forming a mask layer on the first barrier layer;
   patterning the mask layer and forming a plurality of trenches in the mask layer;
   forming a second barrier layer in the trenches;
   removing the mask layer;
   forming a source/drain contact on a portion of the first barrier layer, wherein the source/drain contact is in contact with the first barrier layer and the second barrier layer;
   forming a gate dielectric layer on another portion of the first barrier layer and the second barrier layer, wherein the gate dielectric layer is in contact with the first barrier layer and the second barrier layer; and
   forming a gate layer on the gate dielectric layer.

2. The manufacturing method of claim 1, wherein after patterning the mask layer, the mask layer includes a first portion and a second portion, the first portion defines a location of the source/drain contact, and the second portion defines a location of the gate layer.

3. The manufacturing method of claim 2, wherein patterning the mask layer comprises:
   forming a photoresist layer on the mask layer;
   forming a pattern in the photoresist layer, wherein the pattern exposes a top surface of the mask layer; and
   removing the mask layer exposed by the pattern of the photoresist layer by using a solvent, and exposing a top surface of the first barrier layer.

4. The manufacturing method of claim 3, wherein the solvent has a removal selectivity among the mask layer, the first barrier layer and the second barrier layer, and after removing the mask layer, the first barrier layer and the second barrier layer remain unremoved.

5. The manufacturing method of claim 1, wherein after removing the mask layer, the second barrier layer defines a first region and a second region, wherein the first region defines a location of the source/drain contact, and the second region defines a location of the gate layer.

6. The manufacturing method of claim 1, wherein a thickness of the first barrier layer is less than 6 nm.

7. The manufacturing method of claim 1, wherein a thickness of the second barrier layer is less than 35 nm.

8. The manufacturing method of claim 1, wherein a number of aluminum atoms in the first barrier layer account for 10% to 15% of a total number of the aluminum atoms and gallium atoms in the first barrier layer.

9. The manufacturing method of claim 1, wherein a number of aluminum atoms in the second barrier layer account for 20% to 30% of a total number of the aluminum atoms and gallium atoms in the second barrier layer.

10. The manufacturing method of claim 1, wherein a thickness of the gate dielectric layer is in a range between 20 nm and 30 nm.

* * * * *